United States Patent [19]

Oyama et al.

[11] Patent Number: 5,131,139
[45] Date of Patent: Jul. 21, 1992

[54] ELECTRICAL COMPONENT PLACING APPARATUS

[75] Inventors: Kenshu Oyama; Toshiaki Nakashima, both of Fukuoka, Japan

[73] Assignee: Matsushita Electric Industrial Co., Ltd., Osaka, Japan

[21] Appl. No.: 642,763

[22] Filed: Jan. 18, 1991

[30] Foreign Application Priority Data

Jan. 24, 1990 [JP] Japan ................................ 2-013823

[51] Int. Cl.⁵ ............................................. H05K 3/30
[52] U.S. Cl. ........................................ 29/721; 29/740
[58] Field of Search ................. 29/720, 721, 746, 741, 29/759

[56] References Cited

U.S. PATENT DOCUMENTS 4,793,707 12/1988 Hata et al. ...................... 29/721 X Primary Examiner—Carl E. Hall
Attorney, Agent, or Firm—Stevens, Davis, Miller & Mosher

[57] ABSTRACT

A tapered surface is formed on a nozzle for picking up an electrical component and placing it on a printed circuit as a light diffusing surface. When a light is radiated to the tapered surface, the light is scattered, and the tapered surface becomes bright. Therefore, the electrical component is clearly observed as a black contour in the bright tapered surface by an observing unit.

3 Claims, 3 Drawing Sheets

ELECTRICAL COMPONENT PLACING APPARATUS

BACKGROUND OF THE INVENTION

1. Field of the Invention

This invention relates to an electrical component placing apparatus and, more particularly, to an apparatus for clearly observing a profile of an electrical component picked up and placed by a nozzle for picking up and placing the electrical component by observing means by forming a tapered surface on the lower portion of the nozzle and using the tapered surface as a light diffusing surface.

2. Description of the Prior Art

Conventional means for placing an electrical component on a printed circuit picks up and places the electrical component on the lower end of a nozzle, observes the electrical component by an observing unit on the way of feeding the electrical component toward the printed circuit to detect the positional deviation of the electrical component, then corrects the deviation and places the electrical component on the printed board.

Recently, the electrical component tends to be increasingly reduced in size due to a request of high density and high integration. The minimum electrical component manufactured at present has 1.0 mm × 0.5 mm of longitudinal and lateral sizes, and it is expected to produce an electrical component of further smaller size than this in future.

When the electrical component is reduced in size as described above, the diameter of a nozzle must be correspondingly reduced. When the diameter of the nozzle is, however, reduced, the strength of the nozzle is weakened. Thus, in case of picking up the electrical component, there arise problems in which the nozzle is fluctuated to cause the electrical component to be erroneously picked up, and the nozzle is deflected to be feasibly deformed.

SUMMARY OF THE INVENTION

Accordingly, an object of this invention is to provide an electrical component placing apparatus which can advantageously pick up and place an electrical component of small size and observe the electrical component by an observing unit.

In order to achieve this and other objects according to the present invention, there is provided an electrical component placing apparatus comprising a nozzle for picking up an electrical component and placing the electrical component on a printed circuit positioned by a positioning unit, and an observing unit for radiating a light toward the nozzle side to observe the electrical component picked up by the nozzle, wherein the outer size of said nozzle is increased to be larger than that of the electrical component picked up by said nozzle, a tapered surface is formed on the lower portion of said nozzle, and the tapered surface is formed as a light diffusing surface.

With the arrangement described above, the lower portion of the nozzle is formed with the tapered surface thereby to reduce the outer size of the lower end of the nozzle, thereby picking up the electrical component of small size.

In the observing unit of the apparatus, the light incident to the tapered surface of the lower portion of the nozzle is scattered. Therefore, the electrical component picked up by the lower end of the nozzle is clearly observed by the observing unit as a black contour in the bright tapered surface.

These and other objects and features of the present invention will become apparent from the following detailed description in conjunction with the attached drawings.

DESCRIPTION OF THE PREFERRED EMBODIMENT

An embodiment of an electrical component placing apparatus according to the present invention will now be described with reference to the accompanying drawings.

Figure 1:
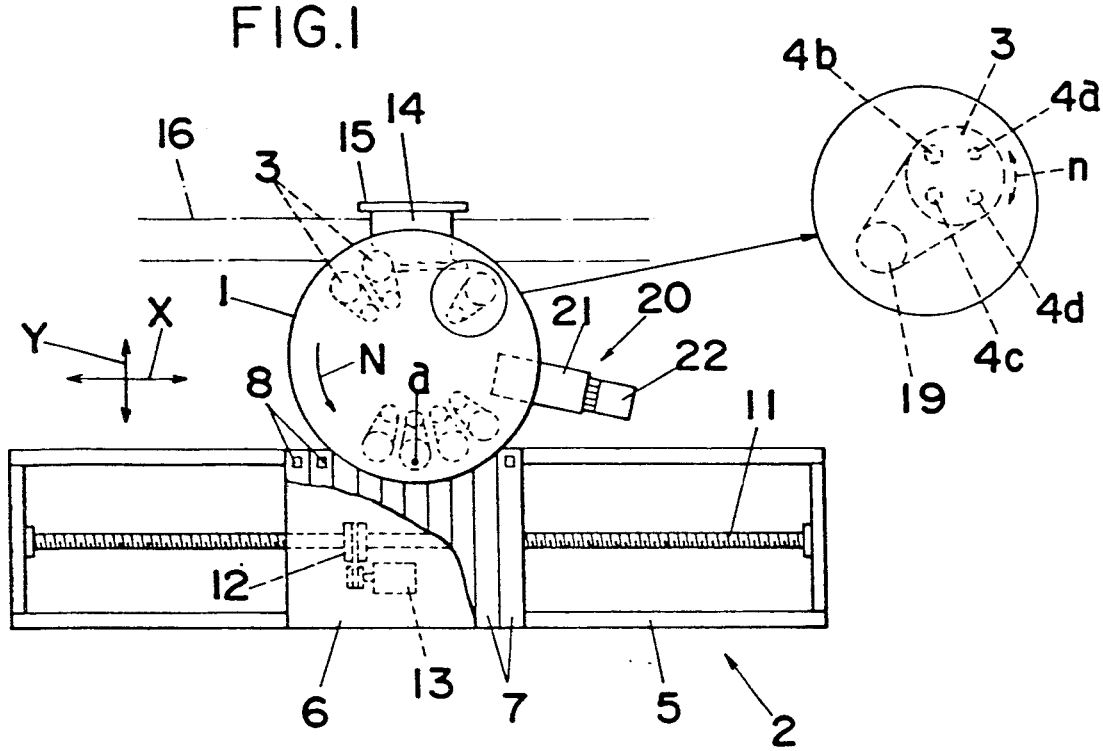
FIG. 1 is a plan view of an electrical component placing apparatus according to an embodiment of the present invention.

FIG. 1 is a plan view of an electrical component placing apparatus of the invention. The electrical component placing apparatus of the embodiment comprises a carrier turntable 1, and an electrical component supply unit 2. A number of electrical component pick and place heads 3 are aligned circumferentially on the carrier turntable 1. Each pick and place head 3 has a plurality of (four in this embodiment) nozzles 4 (4a–4d) having different shapes and sizes. An optimum nozzle for the electrical component to be picked up and placed is selected from the plurality of nozzles 4a to 4d by rotating the pick and place head 3 in a direction of an arrow N by means of an electric motor 19.

The electrical component supply unit 2 is composed by placing a table 6 on a table moving unit 5. A plurality of feeders 7 such as tape units, etc., are placed on the table 6. An electrical component 8 at the end of the feeder 7 is picked up and placed by the nozzles 4a to 4d.

Feed threads 11 are provided in the table moving unit 5. A nut 12 to be engaged with the feed threads 11 and an electric motor 13 for rotating the nut 12 are provided underneath the table 6. Therefore, when the motor 13 is driven, the table 6 reciprocates along axis X to stop the desired electrical component 8 of the feeder 7 at a picking up position a by the nozzles 4.

A printed circuit 14 is provided at opposite side of the electrical component supply unit 2. A positioning unit 15 for positioning the printed circuit 14 and a conveyor 16 for conveying the printed circuit 14 are provided. The pick and place head 3 which picks up the electrical component 8 at the picking up position a feeds the electrical component 8 above the printed circuit 14 by index rotating the carrier turntable 1 in the direction of the arrow N, and places the electrical component 8 on the printed circuit 14. An observing unit 20 is provided between the picking up position a and the positioning unit 15 to observe the electrical component 8 picked up and placed at the lower ends of the nozzles 4 (4a to 4d) from below and to detect the positional deviation of the electrical component 8.

Figure 2:
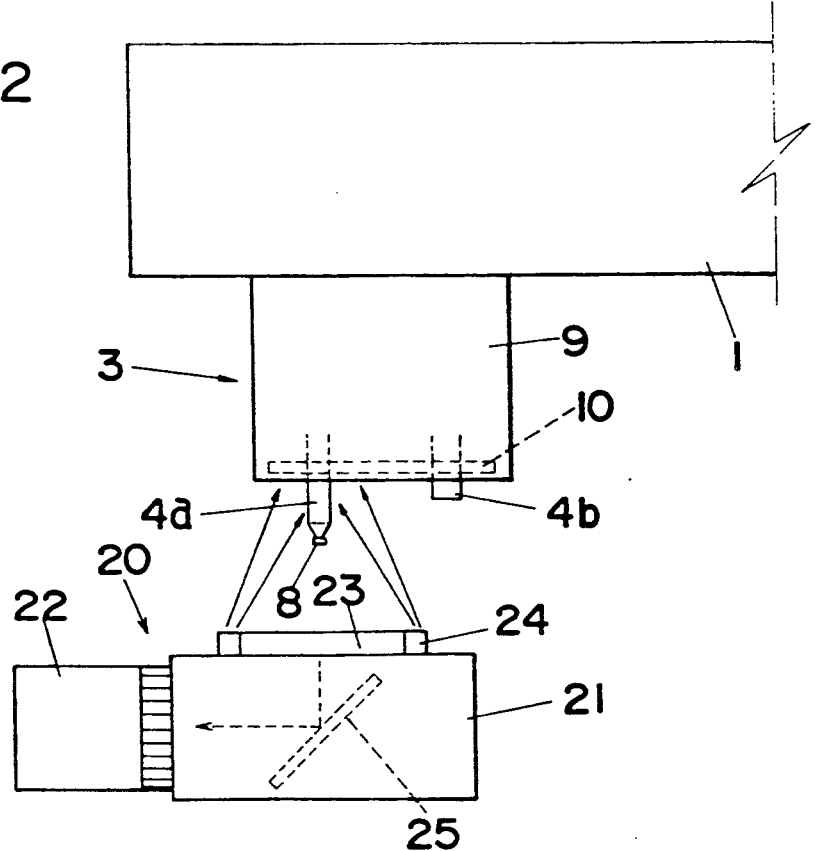
FIG. 2 is a side view of a pick and place head and an observing unit.
Figure 3:
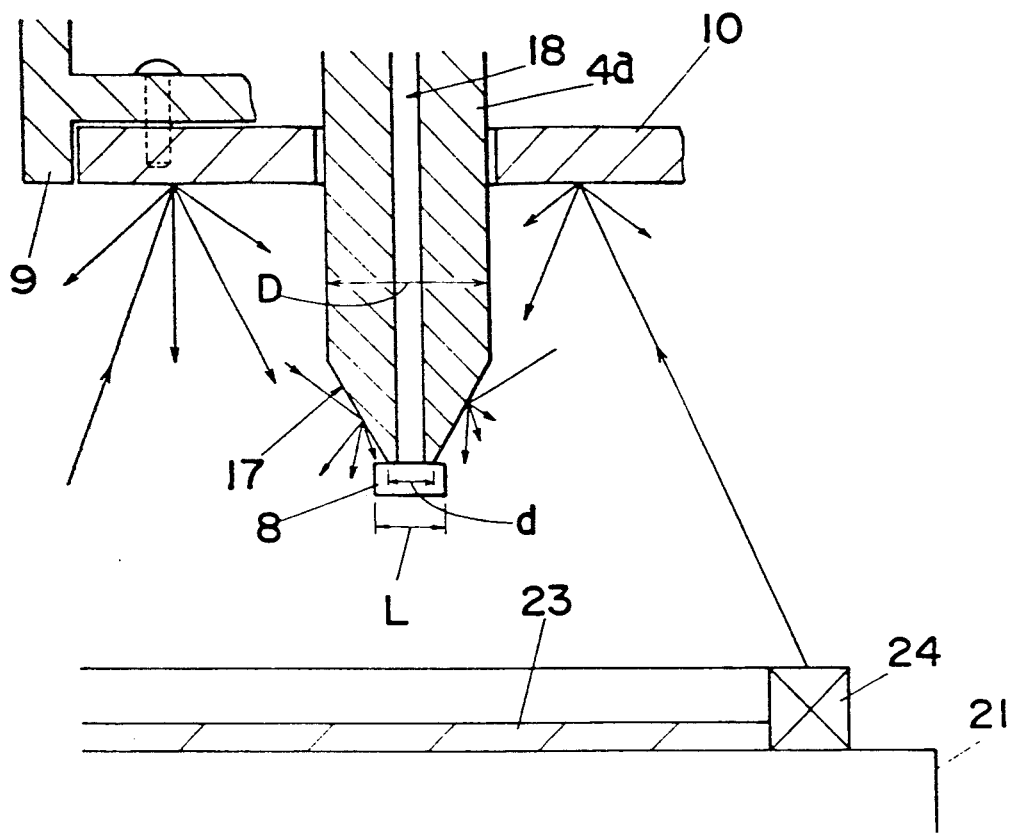
FIG. 3 is a sectional view of a nozzle used in the apparatus.

FIGS. 2 and 3 show the pick and place head 3 and the observing unit 20. The body 9 of the pick and place head 3 is provided, and the lower end of the nozzle 4a protrudes down under the body 9. A light diffuser 10 made of a white acrylic resin plate or the like is provided under the body 9.

Figure 4:
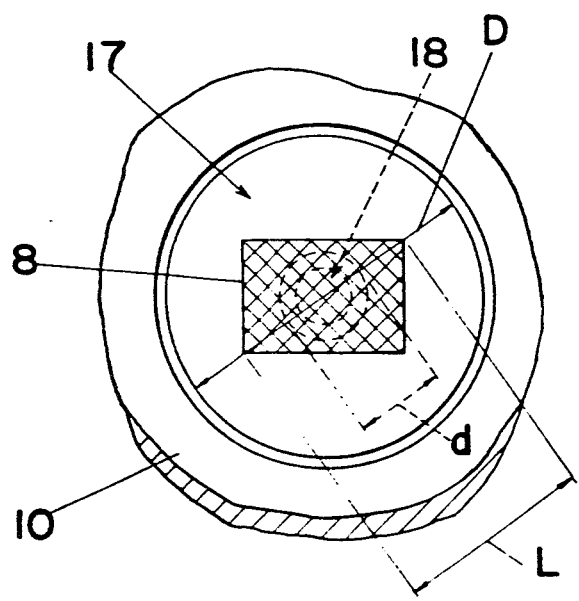
FIG. 4 is a bottom view of the observing unit during observing.

The outer size D of the nozzle 4a is larger than that L of the electrical component 8 picked up by the nozzle 4a (see FIG. 4). A tapered surface 17 is formed on the lower portion of the nozzle 4a to be converged. Thus, the outer size D of the nozzle 4a is increased to increase the strength of the nozzle 4a, thereby eliminating the fluctuation of the nozzle 4a at the picking up position a in case of picking up the electrical component 8 thereby to obviate the picking mistake. The lower portion of the nozzle 4a is formed in the tapered surface 17 to reduce the outer size d of the lower end of the nozzle 4a, thereby picking up and placing the electrical component 8 of small size. The tapered surface 17 is formed as a light diffusing surface by coating it with white paint or roughing it. A central hole 18 for evacuating to pick up the electrical component 8 is formed in the nozzle 4a.

The observing unit 20 has a body case 21 and a camera 22. A transparent stage 23 is provided on the upper surface of the body case 21. An annular light source 24 is provided around the stage 23. A mirror 25 for reflecting a light from above toward the camera 22 is provided in the body case 21.

With the arrangement constructed as described above, the light radiated from the light source 24 toward the nozzle 4a side is scattered by the light diffuser 10. The part of the scattered light is incident to the tapered surface 17, and scattered on the tapered surface 17. Since the tapered surface 17 and the light diffuser 10 scatter the light in this manner, the tapered surface 17 and the light diffuser 10 are brightly observed by the camera 22, and the electrical component 8 is clearly observed as a black contour in the bright tapered surface 17 (see FIG. 4). Thus, since the electrical component 8 can be clearly observed as the black contour in the bright background, its positional deviation can be accurately detected.

Figure 5:
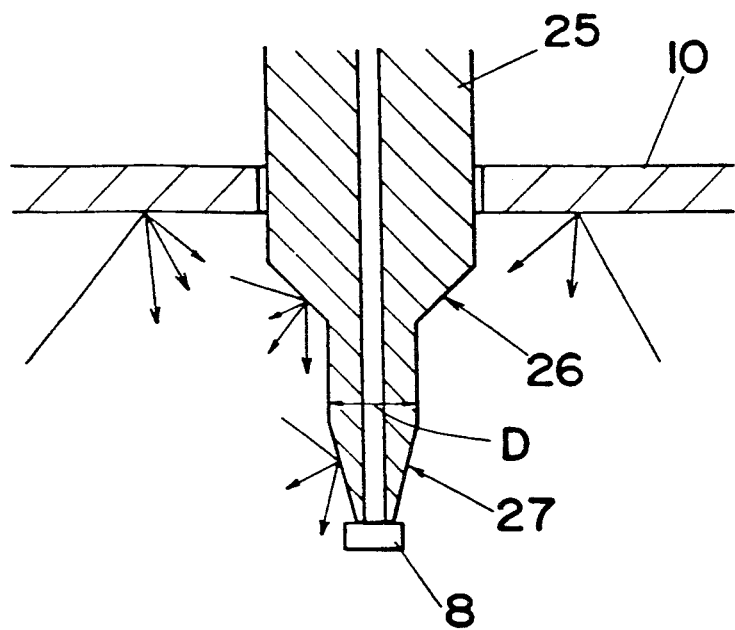
FIGS. 5, 6 and 7 are partial sectional views of other embodiments of the invention.

The nozzle 25 shown in FIG. 5 has two tapered surfaces 26 and 27. Accordingly, the light is scattered on the two tapered surfaces 26 and 27, and the electrical component 8 is clearly observed as the black contour in the bright tapered surfaces 26 and 27. The tapered surfaces may be formed in a plurality of stages as described above.

Figure 6:
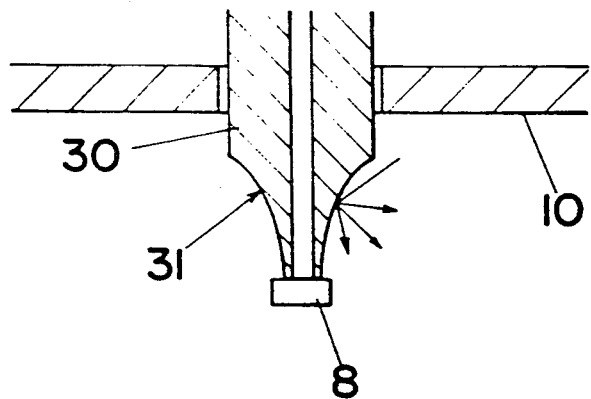
Figure 7:
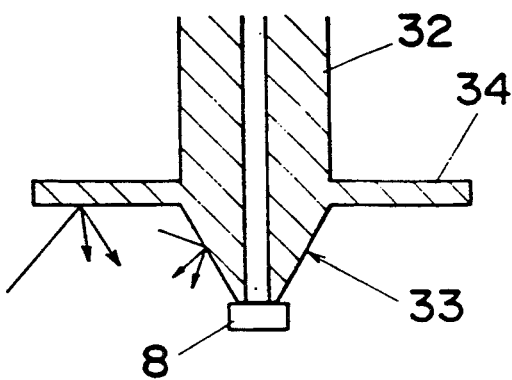

The tapered surface 31 of a nozzle 30 shown in FIG. 6 is curved. A nozzle 32 shown in FIG. 7 is formed with a collar or a protrusion 34, and a tapered surface 33 is formed on the lower portion of the collar 34. The lower surface of the collar 34 is formed as a light diffusing surface, a light incident to the light diffusing surface of the collar 34 is scattered around, the scattered light is further incident to the tapered surface 33 to be scattered. Therefore, the electrical component 8 is observed as a clear contour in the bright background.

According to the present invention as described above, the outer size of the nozzle is increased to increase the strength of the nozzle. Therefore, in case of picking up the electrical component by the nozzle, the nozzle can reliably pick up the electrical component without fluctuation. Since the tapered surface is formed on the lower portion of the nozzle and the outer size of the lower end for picking up the electrical component is reduced, the nozzle can pick up the electrical component of small size. Further, since the tapered surface is formed as the light diffusing surface, the electrical component can be clearly observed as the black contour in the bright tapered surface to accurately detect the positional deviation of the electrical component.

What is claimed is:

1. An electrical component placing apparatus comprising:
    pick and place means having a nozzle for picking up an electrical component and placing it on a printed circuit positioned by a positioning means;
    observing means disposed below a moving path of said pick and place means including a light source for radiating light upwardly towards said pick and place means and a camera for observing the electrical component picked up by said nozzle;
    said nozzle including a main body portion having an outside width adapted to be larger than that of the electrical component to be picked up by said nozzle and a lower portion formed with a light diffusing surface extending downwardly convergently; and
    light diffuser means disposed above said light diffusing surface for causing diffuse reflection of light radiated from said light source and directing a part of the reflected light to said light diffusing surface.

2. An electrical component placing apparatus as defined in claim 1, wherein said light source has ring-like shape.

3. An electrical component placing apparatus as defined in claim 1, wherein said light diffuser means is disposed at lower portion of a main body portion of said pick and place means.

* * * * *